United States Patent [19]
Roman et al.

[11] Patent Number: 5,458,731
[45] Date of Patent: Oct. 17, 1995

[54] METHOD FOR FAST AND NON-DESTRUCTIVE EXAMINATION OF ETCHED FEATURES

[75] Inventors: James J. Roman, San Jose; William T. Chou, Cupertino, both of Calif.

[73] Assignee: Fujitsu Limited, Kanagawa, Japan

[21] Appl. No.: 191,664

[22] Filed: Feb. 4, 1994

[51] Int. Cl.⁶ .................................................... B44C 1/22
[52] U.S. Cl. .............................. 216/59; 216/84; 216/41
[58] Field of Search .................................... 156/626, 644, 156/654, 655, 659.1, 345, 904, 656, 657, 662, 668

[56] References Cited

U.S. PATENT DOCUMENTS

| | | | |
|---|---|---|---|
| 4,393,311 | 7/1983 | Feldman et al. | 250/459.1 |
| 4,496,425 | 1/1985 | Kuyel | 156/626 |
| 4,503,329 | 3/1985 | Yamaguchi et al. | 250/309 |
| 4,512,847 | 4/1985 | Brunsch et al. | 156/626 |
| 4,650,744 | 3/1987 | Amano | 430/313 |
| 4,725,332 | 2/1988 | Spohr | 156/626 |
| 4,725,730 | 2/1988 | Kato et al. | 250/307 |
| 4,733,074 | 3/1988 | Kato et al. | 250/307 |
| 4,767,495 | 8/1988 | Nishioka | 156/626 |
| 4,788,117 | 11/1988 | Cuthbert et al. | 430/30 |
| 4,863,548 | 9/1989 | Lee | 156/345 |
| 4,958,074 | 9/1990 | Wolf et al. | 250/309 |
| 5,023,453 | 6/1991 | Adachi et al. | 250/309 |
| 5,086,230 | 2/1992 | Adachi et al. | 250/492.2 |
| 5,111,043 | 5/1992 | Shigenaka et al. | 250/306 |
| 5,113,072 | 5/1992 | Yamaguchi et al. | 250/309 |
| 5,332,464 | 7/1994 | Namose | 156/626 |

Primary Examiner—William Powell
Attorney, Agent, or Firm—Coudert Brothers

[57] ABSTRACT

Methods for examining a structure etched in a material layer are disclosed. An inspection aperture next to the structure is formed without appreciably disturbing the etching of the structure. The inspection aperture is formed such that it merges with a portion of the structure's perimeter wall to create an inspection window through which the structure may be readily observed. The observed image of the perimeter wall and bottom of the structure is comparable to that obtained by cleaving, and is achieved without destroying the wafer or substrate on which the etched structure is formed. An etch mark designed to implement the method is also disclosed.

9 Claims, 5 Drawing Sheets

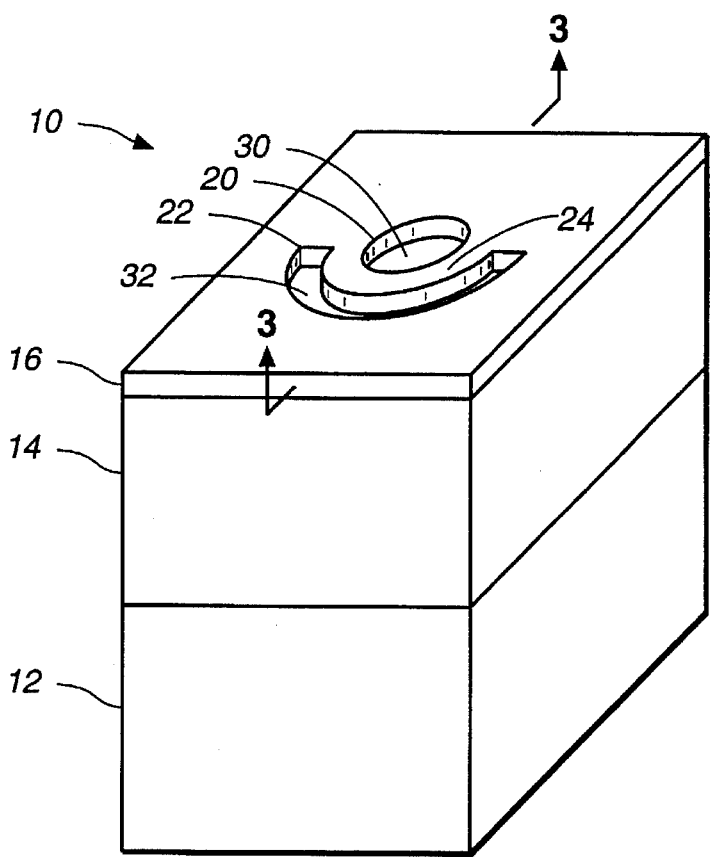
FIG._1
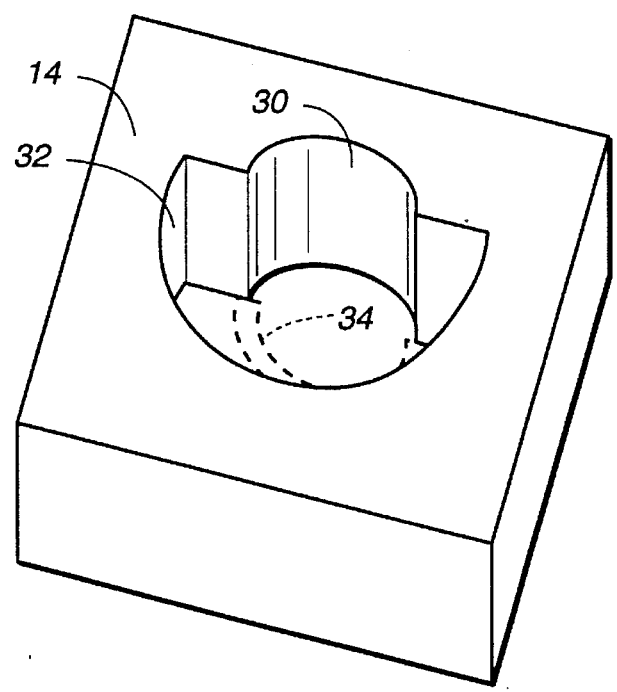
FIG._2

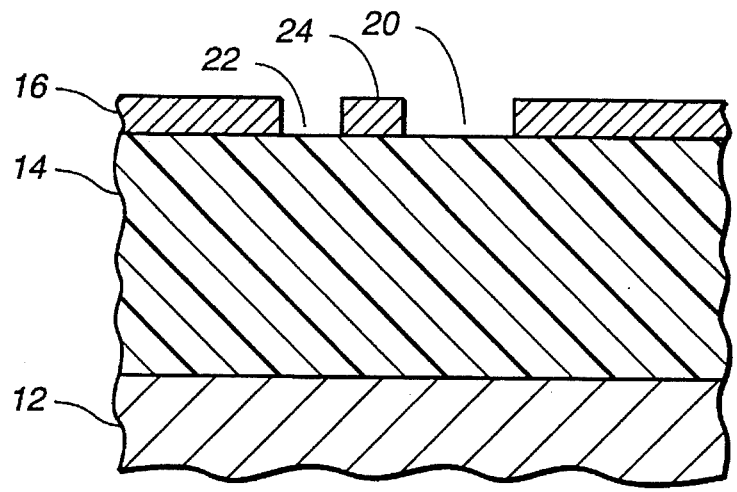
FIG._3
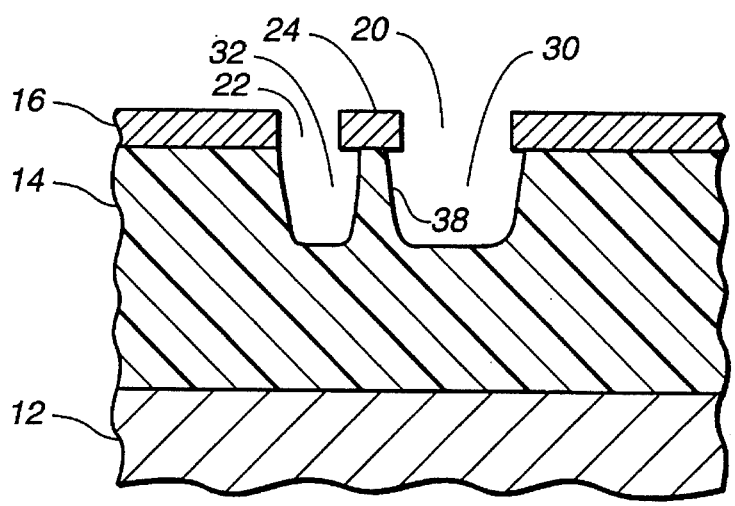
FIG._4
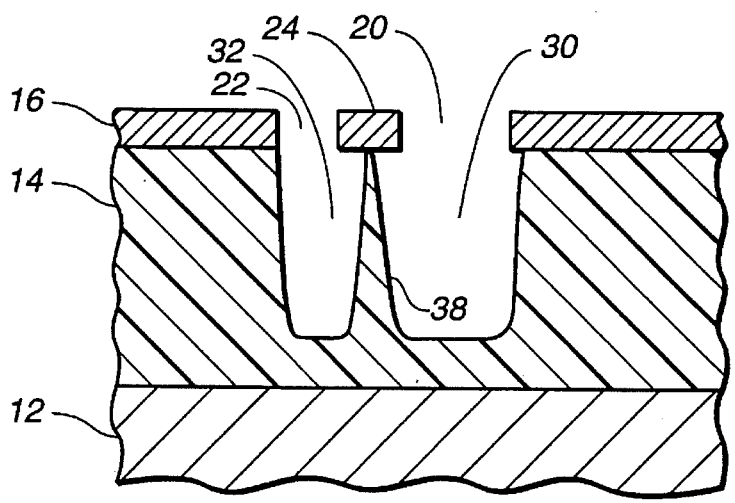
FIG._5

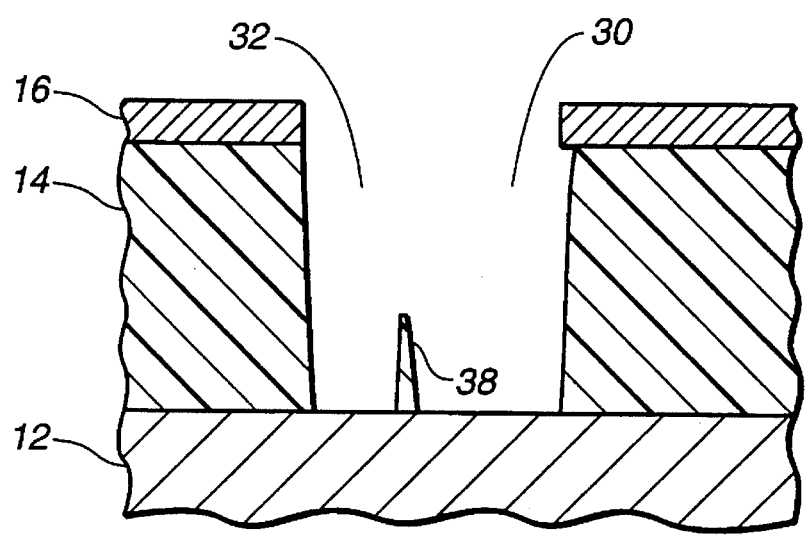
FIG._6
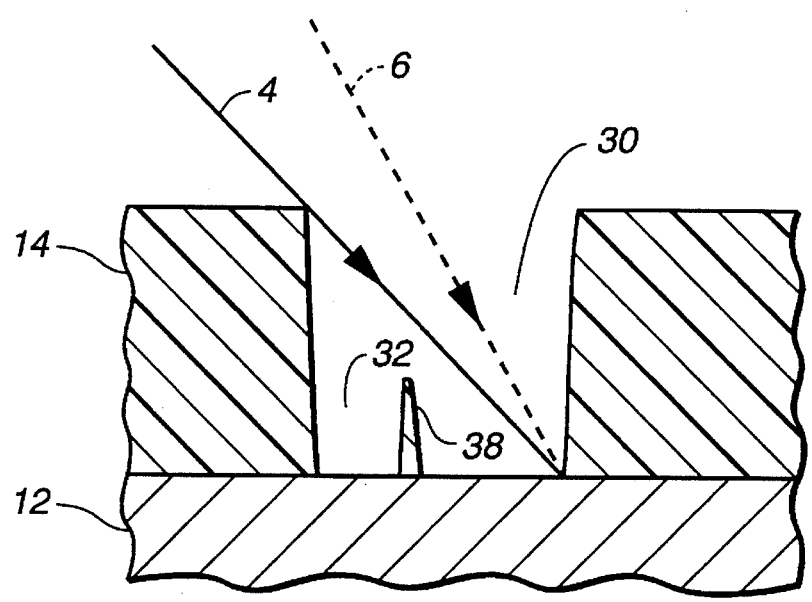
FIG._7

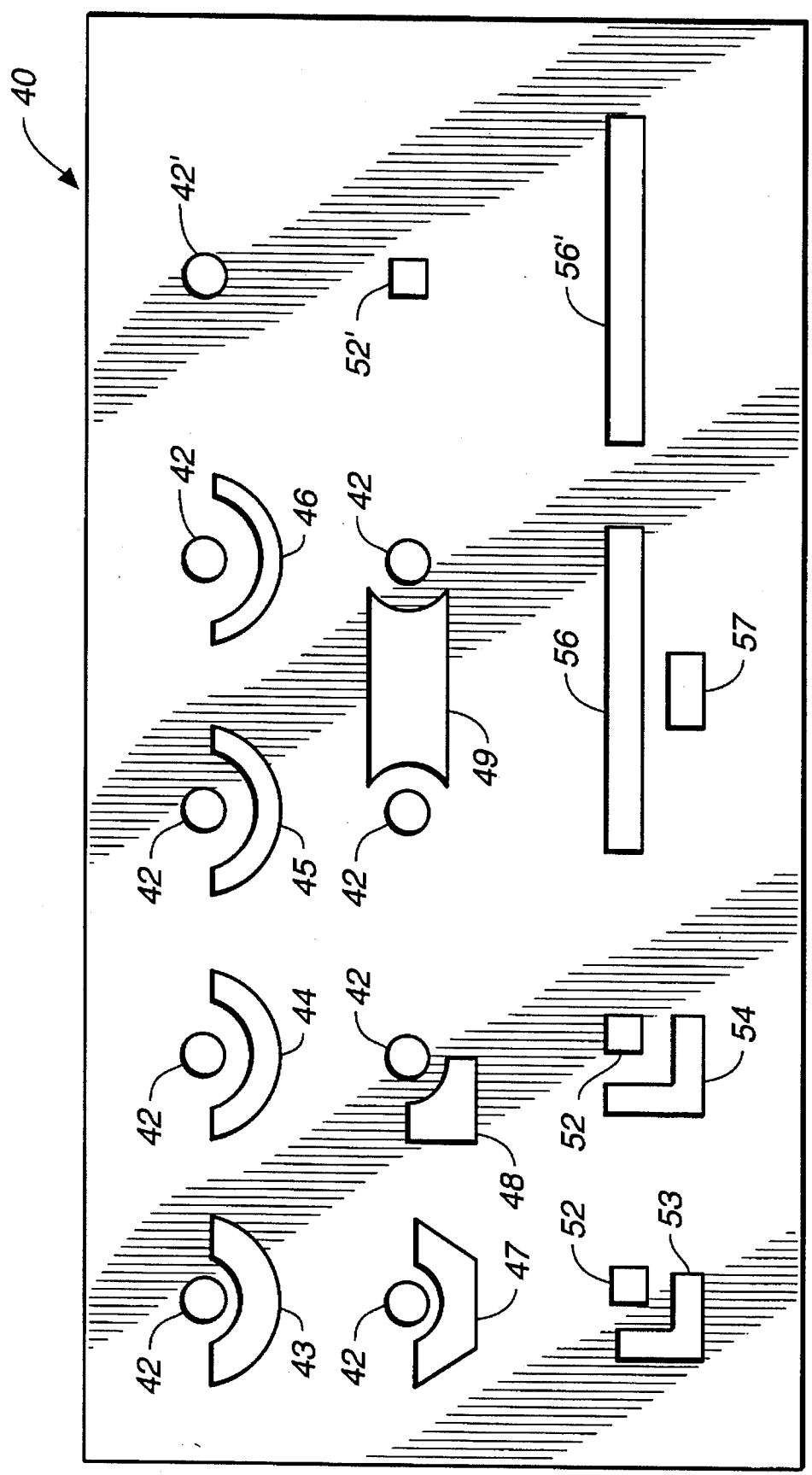
FIG._8

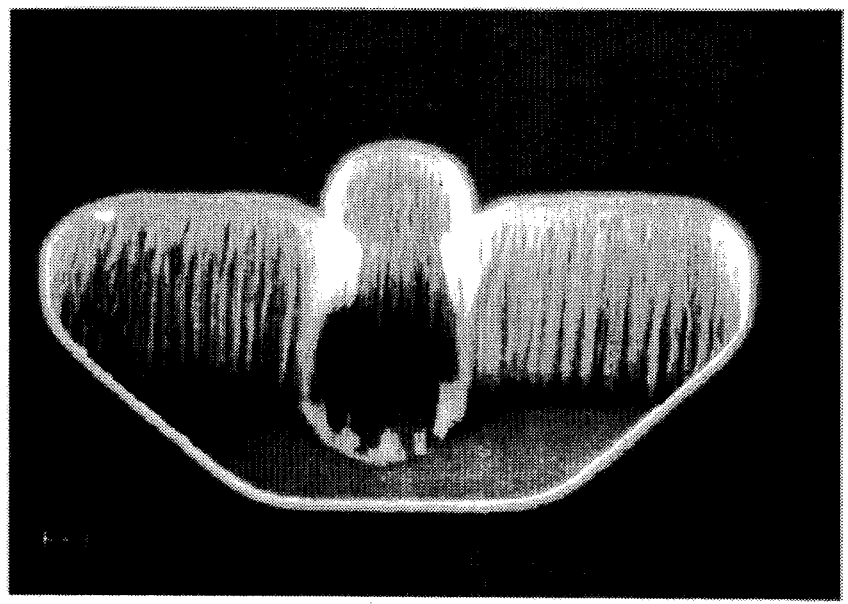
1000x    12.0 kV    10 μm    FCPT    #0025
FIG._9
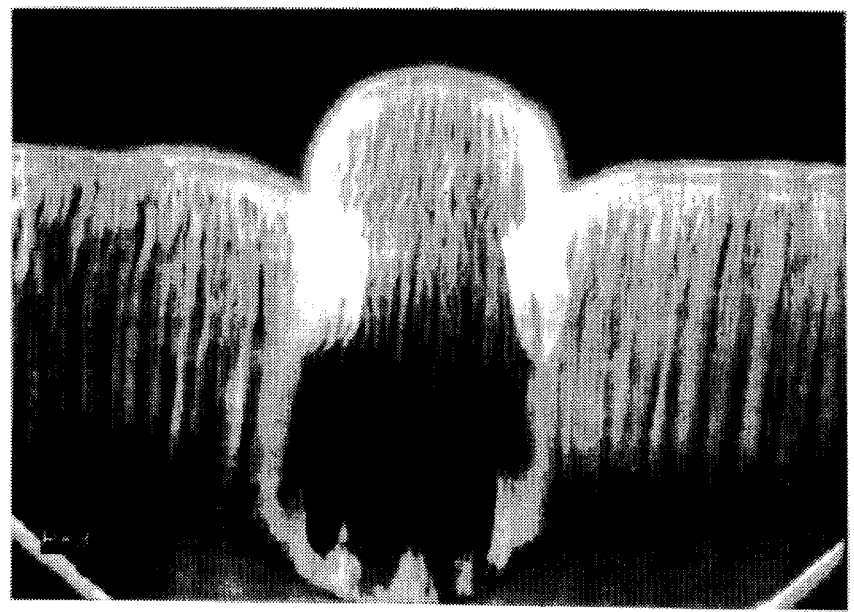
1700x    12.0 kV    10 μm    FCPT    #0026
FIG._10

METHOD FOR FAST AND NON-DESTRUCTIVE EXAMINATION OF ETCHED FEATURES

FIELD OF THE INVENTION

The present invention generally relates to etched structures formed on substrates, semiconductor wafers and the like, and particularly to ways of examining etched structures without destroying the wafer on which the etched structures have been formed.

BACKGROUND OF THE INVENTION

In the field of microelectronics, layers of various materials are commonly formed over wafers or other substrates. Such materials include polymers, oxides, nitrides, metals, and semiconductors (e.g., polysilicon). It is common to etch structures, such as vias and trenches, through one or more of the layers at desired locations in constructing various electrical structures and semiconductor devices. Formation of such structures requires removal of some portions of a material layer.

Material is removed by etching through an etch-resistant mask with either a chemical etchant (wet etching) or with a dry etching process, such as reactive ion etching (RIE) or plasma etching. The etch mask has a pattern generally conforming to the structures to be formed. Generally, anisotropic etching processes are preferred for fine structures since they allow the structure to conform to the mask patterns. Nonetheless, no process is completely anisotropic and, thus, undercutting and other variations between the etched pattern and the mask will occur.

The degree to which a given process is anisotropic depends upon the processing conditions (e.g., temperature, relative concentrations of the etchant's chemical components, agitation rate, plasma energy, etc.). The etch rates also depend upon the area of the mask aperture for the structure, and upon the depth of the structure, particularly for structures formed through relatively small apertures.

It is often necessary to determine the optimum set of processing conditions and etch time for forming a structure in a particular material layer. This optimization usually requires conducting a number of trial processing runs with a set of test structures, each run using a different set of processing conditions and/or etch time, and examining the resulting structures.

Unfortunately, the examination of an etched structure becomes more difficult as its aspect ratio (depth-to-width ratio) increases. The examination of a fine structure, such as a high aspect-ratio via, is typically accomplished by cleaving the substrate or wafer along a cross-sectional plane passing through the structure, and viewing the structure from above the cross-sectional plane, either straight-on or at a slight angle from normal. Unfortunately, a significant amount of time is required to cleave the substrate and prepare it for examination, and the cleaving operation destroys the structure to be examined.

Once the best processing conditions and etch time for a particular structure have been determined, it is often desirable to include a small number of test structures on the production masks to enable periodic monitoring of the production substrates and wafers. Such monitoring may be used to trouble-shoot the etch process or to improve yields by ensuring that the etching process is successful before continuing to the next processing step. Unfortunately, the above cleaving procedure prevents such periodic monitoring since it destroys the substrate.

Accordingly, there is a need in the art for a fast, non-destructive method of examining etched structures, particularly those having small dimensions and/or high aspect ratios, and for a structure which facilitates such a technique. A fast and non-destructive examination capability would greatly speed the optimization of etching processes and readily facilitate process monitoring of production substrates and wafers.

SUMMARY OF THE INVENTION

The present invention encompasses methods for examining a structure etched in a material layer by forming an inspection aperture next to the structure without appreciably disturbing the etching process which forms the structure. The inspection aperture is formed such that it merges with a portion of the structure's perimeter wall to create an inspection window through which the perimeter wall opposite the window may be readily observed. The inspection window and aperture enable the structure's perimeter wall to be viewed at an angle more perpendicular to the perimeter wall. The observed image of the perimeter wall and floor of the structure is comparable to that obtained by cleaving, and is achieved without destroying the wafer or substrate on which the etched structure is formed.

Preferably, the inspection aperture is formed by etching, and is etched simultaneously with the etching of the structure. The inspection aperture preferably merges with the structure near the time that the etching process for the structure is to be stopped so that etching of the inspection aperture does not appreciably affect etching of the structure. The merging of the inspection aperture and the structure is caused by lateral etching of the etching process. As the rate of lateral etching cannot always be predicted with absolute certainty, the present invention further encompasses methods of etching a plurality of like structures in the material layer, each having an inspection aperture etched nearby but separated by different spacing distances. The use of different spacing distances assures that at least one inspection aperture will merge with one of the like structures at the desired time.

The present invention also encompasses etch mask layers for defining the structure(s) and inspection aperture(s). An exemplary etch mask according to the present invention comprises a first aperture for defining a feature to be etched in the material layer and a second aperture for defining an inspection window to be etched in the material layer. The second aperture has a portion of its perimeter adjacent to a portion of the perimeter of the first aperture and spaced therefrom by a substantially uniform distance.

Accordingly, it is an object of the present invention to enable the non-destructive examination of etched structures.

It is another object of the present invention to examine etched structures without the time consuming step of cleaving the substrate upon which the etched structure is formed.

It is another object of the present invention to improve the clarity of the examination of high aspect-ratio structures.

These and other objects of the present invention will become apparent to those skilled in the art from the following derailed description of the invention, the accompanying drawings, and the appended claims.

BRIEF DESCRIPTION OF THE DRAWINGS

FIG. 1 is a partial isometric view of a material layer in which an etched structure, an inspection aperture and a window according to the present invention are to be formed.

FIG. 2 is a partial isometric view of a material layer having an etched structure, an inspection aperture and a window formed therein according to the present invention.

FIGS. 3 through 6 are representative cross-sectional views of the material layer taken along the section line indicated in FIG. 1 at selected time points during an etching process.

FIG. 7 is a cross-sectional view of the material layer taken along the section line indicated in FIG. 1 and after etching the structure and inspection aperture to form a window according to the present invention.

FIG. 8 is a top plan view of an exemplary etch mask layer formed over the material layer showing various patterns of inspection apertures according to the present invention.

FIGS. 9 and 10 are scanning electron micrographs (SEM's) of an exemplary etched structure, inspection aperture, and inspection window formed in a material layer according to the present invention.

DETAILED DESCRIPTION OF THE INVENTION

Shown at 10 in FIG. 1 is a partial isometric view of a material layer 14 in which an etched structure, an inspection aperture, and an inspection window according to the present invention are to be formed. Material layer 14 is formed on a substrate 12, or on top of another material layer formed on substrate 12. A mask layer 16 is formed over material layer 14 and patterned to form apertures therein. Material layer 14 is selectively etched through layer 16 by an etching process. FIG. 1 shows the material layer before any etching has occurred. Mask layer 16 comprises a first aperture 20 for defining the location of an etched structure 30 to be formed in material layer 14, and a second aperture 22 for defining the location of an inspection aperture 32 to be also formed in material layer 14. In FIG. 1, the reference numbers 30 and 32 point to the locations in layer 14 where their respective structure will be formed. In subsequent figures, the reference numbers 30 and 32 point to the formed structures.

In the embodiment shown in FIG. 1, first aperture 20 is substantially circular, and second aperture 22 has the shape of a curved slot. As described below in greater detail, apertures 20 and 22 may have different shapes. A portion of the perimeter of second aperture 22 is adjacent to a portion of the perimeter of first aperture 20, and is spaced therefrom by a substantially uniform distance. A segment 24 of mask layer 16 lies between these two adjacent perimeter portions and, therefore, has a width substantially equal to the spacing distance between the perimeters. The width of segment 24 is preferably chosen such that a substantial portion of material layer 14 underlying segment 24 is removed by lateral etching by the time etched structure 30 is formed through the vertical extent of material layer 14.

An isometric view of structure 30 and inspection aperture 32 formed in layer 14 after etching is shown in FIG. 2. (Mask layer 16 and substrate 12 are not shown in FIG. 2.) Inspection aperture 32 has merged with the etched structure to form an inspection window, or opening, therebetween. The inspection window underlies the location segment 24 of mask layer 16. The normal projection of segment 22 onto the bottom of material layer 14 is shown at 34 in FIG. 2.

In typical applications of the present invention, etched structure 30 is intended to be a duplicate of a primary structure which is to be studied and/or characterized for its properties. Instead of inspecting the primary structure for its properties, structure 30 is inspected. It is therefore important that the formation of inspection aperture 32 does not significantly disturb the etching of structure 30 so that it can be as nearly identical to the primary structure as possible. To achieve substantially undisturbed etching, the width "W" of mask segment 24 is preferably chosen such that inspection aperture 32 merges with the etched structure just before structure 30 is etched through the vertical extent of material layer 14. Processed in this manner, the etching of inspection aperture 32 has minimal impact on the etching of structure 30.

As is known in the art, there are localized variations in the horizontal and vertical etch rates around apertures due to variations in the local transport rate of etchant into the apertures and the local transport rate of etch products out of the apertures. These local transport rates are often dependent upon the aperture size, the localized depletion of etchant by adjacent apertures, and generation of etch products by adjacent apertures, the latter effects being known as "loading effects." For these reasons, it is important that aperture 32 be separated from structure 30 up until the time when structure 30 is etched through the vertical extent of material layer 14.

Aperture 32 need not merge along the entire vertical extent of material layer 14. It need only merge enough to permit the bottom of structure 30 to be viewed through aperture 32 and the inspection window at a viewing angle, or tilt, desired by the user. The viewing angle is often limited in SEM microscopes, typically to 45°, as measured from the direction normal to the surface of layer 14. The height of the inspection window should, preferably, be at least one-fourth the thickness of the material layer 14, and may range between one-third and two-thirds of the thickness of material layer 14.

Preferably, in order to achieve high aspect ratio structures, the etch process used in connection with the present invention is highly anisotropic. Nonetheless, even the most anisotropic process will cause both lateral and horizontal etching. Given the thickness of layer 14, the vertical and horizontal etch rates for the etch process, and the desired height of the inspection window, the width "W" of segment 24 may be readily approximated by straightforward mathematical analysis. In one embodiment of the present invention, the width "W" is substantially equal to the sum of lateral etch extents in the structure and inspection aperture, the extents being measured at the tops of the structure and aperture at the end time of the etching process. The end time is the expected time needed for the etching process to etch through the vertical extent of material layer 14 given its expected vertical etch rate, plus an additional time interval to account for process tolerances. The additional time is sometimes referred to as an "over etch" time, and is typically 10% to 20% of the expected etching time.

Because of the localized variations in the etch rates due to the dependence of the etch rates on various process parameters (e.g., temperature, aperture size), as described above, the exact etch rates for the structure and aperture are not entirely predictable. The unpredictability may be addressed by constructing several structures 30 spaced apart from corresponding apertures 32 by different widths "W". One or more of these apertures will generally merge with its corresponding structure at the desired time. Generally, it is possible to estimate average vertical and horizontal etch rates for an etching process so that an approximate width for segment 24 can be determined. A range of different widths "W" can then be determined.

FIGS. 3 through 6 are representative cross-sectional views of material layer 14 taken along the section line indicated in FIG. 1 at selected time points of an exemplary etching process. FIG. 3 shows the structure at the start of etching, FIGS. 4 and 5 show it at intermediate stages of the etching, and FIG. 6 at the end of etching. In this example, the etching process is substantially anisotropic, and structure 30 and inspection aperture 32 are simultaneously etched. In FIGS. 4–6, a reference number 38 identifies the partition located between structure 30 and aperture 32 and underneath mask segment 24 that is formed by the etching of material layer 14 in the vertical direction. Lateral etching causes partition 38 to have a tapered thickness, with the thickness being the smallest near mask segment 24. Preferably, partition 38 remains intact during most of the etching (see FIG. 5) to minimize any effect that the etching of inspection aperture 32 may have upon the etching of structure 30.

Near the end of etching, the top portion of partition 38 is etched through to separate partition 38 from mask segment 24. Inspection aperture 32 then merges with structure 30 to form an inspection window. The rate at which partition 38 is etched is then slightly increased since the top of partition 38 is exposed to the etchant. FIG. 6 shows the merged structures at the end of the etching process. Once partition 38 is separated from segment 24, it no longer supports segment 24. In some cases, mask segment 24 is left intact after etching, and in such cases often has a slight droop at the middle of its span. In other cases, mask segment 24 is detached from the rest of mask layer 16 by the etching process, as is shown in FIG. 6. The detached segment 24 appears to be etched by the etchant and reduced in size, and does not appear to substantially interfere with the etching of structure 30 or aperture 32.

After etching, structure 30 may be inspected through inspection aperture 32 and the resulting window. Mask layer 16 may either be left on or removed for inspection. FIG. 7 shows a line of sight 4 through aperture 32 and the inspection window with mask 16 and segment 24 removed. If mask layer 16 is left on for inspection and if mask segment 24 remains after etching, the lower portion of structure 30 can generally be inspected at a relatively shallow line of sight passing through inspection aperture 32 and the inspection window (e.g., line giving a good view of the sidewall of the structure. Those portions of structure 30 blocked from view by segment 24 can generally be viewed at a steeper line of sight passing through aperture 20 of mask layer 16. The best line of sight available without inspection aperture 32 and a window is shown at 6 in FIG. 7. It can be seen that without the inspection window created by the present invention, the ability to view the sidewalls and bottom of a structure is substantially impaired.

FIG. 8 shows a top plan view of an etch mask layer 40 formed over a material layer showing a variety of exemplary structures and related inspection apertures according to the present invention. Specifically, mask 40 comprises a plurality of apertures 42 for defining corresponding circular via structures, and a plurality of apertures 43–49 for defining corresponding inspection apertures for the vias defined by apertures 42. Apertures 42 are substantially identical to an aperture 42' which defines a primary structure. The structures defined by apertures 42 are intended to be duplicates of the primary structure defined by aperture 42', and are studied and/or characterized for their properties to determine the properties of the primary structure. Inspection apertures 43–46 comprise semicircular slots (i.e., annular sections), each having a different spacing distance W from its corresponding aperture. While slots 43–46 have different widths, those skilled in the art will recognize that the slot width may be held constant while the spacing varies.

Inspection aperture 47 has a semi-circular inner perimeter, and an outer perimeter formed by three line segments. In general, it is easier and less expensive to form line segments than circular segments on the photolithography mask used to pattern mask layer 40. Similarly, inspection aperture 48 has a semicircular inner perimeter and an outer perimeter formed by two line segments. Inspection aperture 49 is positioned next to two apertures 42, and spaced apart therefrom by different distances.

FIG. 8 also shows apertures 52 and 52' which define square via structures, aperture 52' defining a primary via structure. Two inspection apertures 53 and 54 are included on mask 40 for apertures 52. Each aperture 53 and 54 has an inner perimeter formed by two line segments, and an outer perimeter formed by two line segments. Apertures 56 and 56' define trench structures, aperture 56' defining a primary trench structure. A rectangular-shaped inspection aperture 57 is included on mask 40 for aperture 56. Typically, aperture 56 (and 56') has a width which is smaller than its length, and which is smaller than the thickness of material layer 14.

In one embodiment of the present invention, material layer 14 comprises polyimide, mask layer 16 comprises a patterned layer of aluminum, chromium, or a conventional positive photoresist (patterned by well-known techniques), and the etching process comprises reactive ion etching (RIE) or plasma etching. However, layer 14 may comprise other materials, and different etching processes may be used, such as wet chemical etching. Both anisotropic and isotropic types of etching may be used with the present invention. Moreover, mask layer 16 may comprise different materials, preferably those most appropriate to the particular etching process being employed.

FIGS. 9 and 10 are scanning electron micrographs (SEM's) of an exemplary etched structure, inspection aperture, and inspection window formed in a polyimide layer according to the present invention. The etched structure is a circular via having a diameter of approximately 13 microns and a height of approximately 40 microns. The structure is viewed at an angle of 35° from vertical. Prior to etching, the mask inspection aperture comprised a shape similar to that of mask aperture 47 shown in FIG. 8, and was spaced from the mask aperture for the structure by approximately 4 microns. A magnification of 1,000 is used in FIG. 9, and a magnification of 1,700 is used in FIG. 10. As can be seen from the micrographs, the quality of etching at the bottom of the via structure (e.g., etch residue) and the wall profiles (e.g., tapers) can be readily determined despite the large aspect ratio of the via. Additionally, the surface morphology of the via walls and many of the via's dimensions can be readily determined.

While the present invention has been described particularly with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within

What is claimed is:

1. A method of examining a structure etched in a material layer comprising the step of etching an inspection aperture along a selected section of the structure's perimeter wall while the structure is being etched, said inspection aperture being initially spaced from said structure and being etched such that a portion of said aperture's side wall along said selected section of said perimeter wall merges with a portion of said perimeter wall to form an opening between said inspection aperture and said etched structure.

2. The method of claim 1 further comprising the step of viewing the structure by a magnification means through a sight line passing through said opening.

3. The method of claim 1 further comprising the step of determining a property of a section of the structure's perimeter wall structure which is opposite to said opening.

4. The method of claim 1 wherein said opening has a width extending along substantially the entire width of the selected section of perimeter wall.

5. The method of claim 1 wherein said opening has a height that is at least one-forth the thickness of the material layer by the time the structure is etched through the material layer.

6. The method of claim 1 wherein said opening has a height that is between one-third and two-thirds the thickness of the material layer by the time the structure is etched through the material layer.

7. A method of forming an etched structure and an inspection window therefor in a material layer, said method comprising the steps of:

etching a first aperture in the material layer to form said structure; and etching a second aperture in the material layer located adjacent to said first aperture such that said apertures merge together at adjacent portions of their respective side walls to form an inspection window thereat.

8. The method of claim 7 wherein said apertures are etched simultaneously and wherein said inspection window is substantially formed before said structure is etched through said material layer.

9. A method of forming an etched structure and an inspection window therefor in a material layer, said method comprising the steps of:

depositing a mask layer over said material layer;

forming a first aperture in the mask layer for defining the location of the etched structure;

forming a second aperture in the mask layer having a portion of its perimeter adjacent to a portion of the perimeter of the first aperture, said perimeter portions being spaced from one another by a substantially uniform distance to form a segment of the mask layer between said perimeters, said spacing distance being chosen such that a portion of the material layer underlying said segment of said mask layer may be removed by lateral etching before the structure is etched through the material layer; and etching the exposed portions of the material layer to form the etched structure and to remove material under said segment of said mask layer to form an inspection window thereunder.

* * * * *